US012604681B2

(12) United States Patent
Lee et al.

(10) Patent No.: US 12,604,681 B2
(45) Date of Patent: Apr. 14, 2026

(54) THIN FILM DEPOSITION METHOD AND MANUFACTURING METHOD OF ELECTRONIC DEVICE APPLYING THE SAME

(71) Applicants: SK hynix Inc., Icheon (KR); INCHEON NATIONAL UNIVERSITY RESEARCH & BUSINESS FOUNDATION, Incheon (KR)

(72) Inventors: Do Han Lee, Icheon (KR); Eun Soo Kim, Icheon (KR); Seung Wook Ryu, Icheon (KR); Sung Hwan Jo, Icheon (KR); Han-Bo-Ram Lee, Incheon (KR); Abu Saad Aqueel Ahmad Ansari, Incheon (KR); Ngoc Le Trinh, Icheon (KR)

(73) Assignees: SK hynix Inc., Incheon (KR); INCHEON NATIONAL UNIVERSITY RESEARCH & BUSINESS FOUNDATION, Incheon (KR)

( * ) Notice: Subject to any disclaimer, the term of this patent is extended or adjusted under 35 U.S.C. 154(b) by 466 days.

(21) Appl. No.: 18/169,799

(22) Filed: Feb. 15, 2023

(65) Prior Publication Data

US 2023/0268184 A1     Aug. 24, 2023

(30) Foreign Application Priority Data

Feb. 18, 2022     (KR) ........................ 10-2022-0021554

(51) Int. Cl.
 *H01L 21/285*     (2006.01)
 *C23C 16/02*     (2006.01)
 (Continued)

(52) U.S. Cl.
 CPC ........ *H01L 21/28568* (2013.01); *C23C 16/02* (2013.01); *C23C 16/45525* (2013.01);
 (Continued)

(58) Field of Classification Search
 CPC ......... H01L 21/28568; H01L 21/02304; H01L 21/02315; H01L 21/28562;
 (Continued)

(56) References Cited

U.S. PATENT DOCUMENTS 8,319,275 B2 * 11/2012 Shim ...................... H10D 89/10
                                                      257/329
11,028,477 B2   6/2021 Saly et al.
 (Continued)

FOREIGN PATENT DOCUMENTS

KR     1020030090872 A     12/2003
KR     1020210021100 A     2/2021

*Primary Examiner* — Dale E Page
*Assistant Examiner* — Quovaunda Jefferson

(57)     ABSTRACT

A thin film deposition method may include preparing a substrate structure having an opening region formed in a vertical direction and a plurality of holes formed in a horizontal direction in each of two side portions exposed by the opening region, and adsorbing an inhibitor to surfaces of the substrate structure so that an adsorption density of the inhibitor outside of the plurality of holes is higher than an adsorption density inside of the plurality of holes by adsorbing the inhibitor in a deposition environment in which a gas diffusivity is larger in the vertical direction than in the horizontal direction. A deposition process of a material film on the inside and outside of the plurality of holes is then performed, wherein a deposition rate of the material film may vary according to the adsorption density of the inhibitor.

12 Claims, 14 Drawing Sheets

(51) Int. Cl.
    *C23C 16/455*     (2006.01)
    *H01J 37/32*     (2006.01)
    *H10B 69/00*     (2023.01)

(52) U.S. Cl.
    CPC .. *H01J 37/32394* (2013.01); *H01J 37/32816*
        (2013.01); *H10B 69/00* (2023.02); *H01J*
        *2237/332* (2013.01)

(58) Field of Classification Search
    CPC ......... H01L 21/76814; H01L 21/76826; H01L
        21/76877; C23C 16/02; C23C 16/45525;
        C23C 16/0272; C23C 16/045; C23C
        16/45534; C23C 16/06; H01J 37/32394;
        H01J 37/32816; H01J 2237/332; H10B
        69/00; H10B 43/27; H10B 41/27; H10B
        41/35; H10B 43/35
    See application file for complete search history.

(56)                 References Cited

U.S. PATENT DOCUMENTS

2005/0158590 A1 *   7/2005   Li .......................... C23C 28/325
                                                     427/255.19
2015/0243545 A1 *   8/2015   Tang ................ H01L 21/76837
                                                    118/704
2021/0292904 A1 *   9/2021   Takano ............. C23C 16/45551

* cited by examiner

< 1st Pressure Condition >

< Comparative Example >

< Comparative Example >

< Comparative Example >

FIG. 6

THIN FILM DEPOSITION METHOD AND MANUFACTURING METHOD OF ELECTRONIC DEVICE APPLYING THE SAME

CROSS-REFERENCES TO RELATED APPLICATION

The present application claims, under 35 U.S.C. § 119(a), the benefit of Korean application No. 10-2022-0021554, filed on Feb. 18, 2022 which is herein incorporated by reference in its entirety.

BACKGROUND OF THE INVENTION

1. Field

The present invention relates to a material deposition method and a manufacturing method of a device to which the material deposition method is applied, and more particularly, to a thin film deposition method on a substrate structure having a three-dimensional pattern portion and a manufacturing method of an electronic device to which the same is applied.

2. Description of the Related Art

As the degree of integration of various electronic devices including semiconductor devices continues to increase and patterns become finer, various limitations and problems may occur in the thin film deposition process according to the prior art. For example, with the high integration of memory devices, the aspect ratio and the number of stacking stages of a three-dimensional vertical NAND (i.e., V-NAND) device are increasing, and at the same time, a tier size of the stacking stages is decreasing in the vertical direction. Accordingly, during a process of filling vias and trenches, that is, a pattern filling process, defects such as voids and seams may be formed.

In particular, a metal used as an electrode material in a three-dimensional V-NAND device (NAND flash device), for example, tungsten, may form voids or seams in a plug due to non-uniform deposition behavior, which voids or seams may increase resistance in the plug. When a metal film is deposited on a via or trench structure by a conventional thin film deposition method, more deposition occurs at the inlet (or entrance) and top of the via or trench structure due to the geometric shape or surface energy difference of various regions, and the voids and seams are formed inside thereof, which causes a decrease in conductivity and various problems due to a decrease in the conductive area. In addition, when a metal film is deposited according to an atomic layer deposition method, gas may remain inside a void or a seam. This residual gas may damage an underlying structure, for example, a substrate portion, or may cause various problems due to diffusion of trapped impurities.

Therefore, a development of a thin film deposition technology capable of overcoming the limitations of the conventional thin film deposition method, effectively suppressing the occurrence of defects such as voids and seams with respect to a substrate structure having a three-dimensional fine pattern and securing excellent thin film properties, is required.

SUMMARY OF THE INVENTION

The technical object to be achieved by the present invention is to provide a thin film deposition method capable of overcoming the limitations and problems of the conventional thin film deposition method, effectively suppressing the occurrence of defects such as voids and seams with respect to a substrate structure having a three-dimensional pattern structure, and securing excellent physical properties of a deposited thin film.

In addition, the technical object to be achieved by the present invention is to provide a method of manufacturing an electronic device to which the above-described thin film deposition method is applied.

The object to be achieved by the present invention is not limited to the above-mentioned objects, and other objects not mentioned will be understood by those skilled in the art from the following description.

According to one embodiment of the present invention, there is provided a thin film deposition method for a substrate structure having a three-dimensional pattern portion, comprising: preparing a substrate structure having an opening region formed in a vertical direction and a plurality of holes formed in a horizontal direction in each of two side portions exposed by the opening region; adsorbing an inhibitor to a surface of the substrate structure so that an adsorption density of the inhibitor on a surface outside of the plurality of holes may be higher than an adsorption density on a surface inside of the plurality of holes by performing a process for adsorbing the inhibitor on the surface of the substrate structure in a deposition environment in which a gas diffusivity in the vertical direction is larger than a gas diffusivity in the horizontal direction; and performing a deposition process of a given material film on the surface inside of the plurality of holes and the surface outside of the plurality of holes, wherein a deposition rate of the material film may vary according to the adsorption density of the inhibitor.

A first adsorption density of the inhibitor at an inlet portion of the hole and a portion peripheral to the inlet portion may be higher than a second adsorption density of the inhibitor at a bottom portion of the hole and a portion peripheral to the bottom portion.

The first adsorption density of the inhibitor may be at least about three times higher than the second adsorption density.

The adsorbing of the inhibitor may include generating a plasma including the inhibitor or an ionic species of the inhibitor, and supplying the plasma to the opening region, and wherein the plasma may have a larger diffusivity in a vertical direction than in a horizontal direction.

The adsorbing of the inhibitor may include setting a pressure condition of a chamber in which the substrate structure is provided as a first pressure condition, and supplying a gas including the inhibitor to the opening region under the first pressure condition, and wherein the gas including the inhibitor may have a larger diffusivity in a vertical direction than in a horizontal direction under the first pressure condition.

In the first pressure condition, a pressure of the chamber may be in the range of about $10^{-3}$ Torr to 1 atm.

The deposition process of the material film may be performed under a second pressure condition different from the first pressure condition, and a pressure of the chamber under the second pressure condition may be lower than a pressure of the chamber under the first pressure condition.

The adsorbing of the inhibitor may include setting a pressure condition of the chamber in which the substrate structure is provided as a first pressure condition, generating a plasma including the inhibitor or an ionic species of the inhibitor, and supplying the plasma to the opening region under the first pressure condition, and wherein the plasma may have a larger diffusivity in a vertical direction than in a horizontal direction under the first pressure condition.

The deposition process of the material film may be performed using an atomic layer deposition (ALD) process.

The material film may be a conductive film.

According to another embodiment of the present invention, there is provided a manufacturing method of an electronic device, the method comprising: preparing a substrate structure having a three-dimensional pattern portion; and depositing a material film on the substrate structure using a thin film deposition method.

The electronic device may include a three-dimensional Vertical-NAND flash device.

The material film may be a conductive film.

The manufacturing method of the electronic device may include defining a gate electrode from the conductive film.

According to embodiments of the present invention, it is possible to implement a thin film deposition method capable of overcoming the limitations and problems of the conventional thin film deposition method, effectively suppressing the occurrence of defects such as voids and seams in a substrate structure having a three-dimensional pattern structure and securing excellent properties of the deposited thin film, by performing a process of adsorbing an inhibitor in a deposition environment in which a gas diffusivity in a vertical direction is greater than a gas diffusivity in a horizontal direction with respect to the substrate structure, and then depositing a target material film thereon, Because the thin film deposition method according to the embodiments of the present invention may be usefully applied to the manufacture of various electronic devices, it may be possible to manufacture an electronic device having high integration and excellent performance by using the method.

BRIEF DESCRIPTION OF THE DRAWINGS

FIG. 6 is a simulation result illustrating diffusivity of gas diffused in vertical and horizontal directions in a pattern structure under a pressure condition according to a comparative example.

DETAILED DESCRIPTION OF THE INVENTION

Figure 1A:
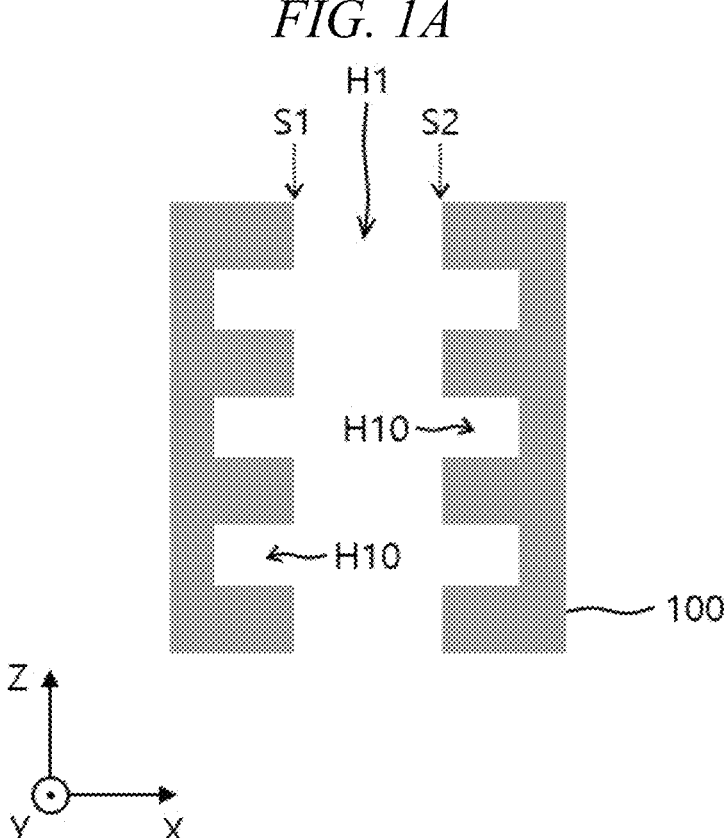
FIG. 1A to FIG. 1D are cross-sectional diagrams illustrating a thin film deposition process on a substrate structure having a three-dimensional pattern portion according to an embodiment of the present invention.

Hereinafter, the embodiments of the present disclosure will be described in detail with reference to the accompanying drawings.

The embodiments of the present disclosure described below are provided to clearly explain the present invention to those having common knowledge in the related art, and the scope of the present invention is not limited by the following embodiments. The disclosed embodiments may be modified in many different forms.

The terminology used herein is used to describe specific embodiments, and is not used to limit the present invention. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using the disclosed present invention unfairly.

Hereinafter, embodiments will be described in detail with reference to the accompanying drawings. The size or the thickness of the regions or the parts illustrated in the accompanying drawings may be exaggerated for clarity and convenience of description. The same reference numerals refer to the same elements throughout the detailed description.

FIG. 1A to FIG. 1D are cross-sectional diagrams illustrating a thin film deposition process on a substrate structure 100 having a three-dimensional pattern portion according to an embodiment of the present invention.

Referring to FIG. 1A, a substrate structure 100 having a three-dimensional pattern portion may be prepared. The substrate structure 100 may have a substrate and the three-dimensional pattern portion formed on the substrate. The substrate may be, for example, a silicon single crystal substrate. In another embodiment, the substrate may be a polycrystalline or an amorphous silicon substrate or layer, or may include an alloy based on a group IV element, a compound semiconductor based on a group II-VI or group III-V, a polymer material, a ceramic material, or a composite material of two or more thereof, but the present invention is not limited thereto.

The substrate structure 100 may include an opening region H1 formed in a substantially vertical direction Z. In addition, the substrate structure 100 may include a plurality of holes (or grooves) H10 formed to extend in a substantially horizontal direction Y in each of two side portions (hereinafter, first and second side portions) S1 and S2 exposed by the opening region H1. The plurality of holes H10 in each of the first and second side portions S1 and S2 may be disposed to be spaced apart from each other in a vertical direction. The first and second side portions (first and second side surface portions) S1 and S2 may face each other. The plurality of holes H10 formed in the first side portion S1 may be disposed to correspond to the plurality of holes H10 formed in the second side portion S2 at the same height, respectively. The substrate structure 100 may be said to have the above-described three-dimensional pattern structure. While the figures illustrate the opening region H1 as a through opening (that is, an opening that penetrates the entire height of the substrate structure 100 and is open at both top and bottom), embodiments are not limited thereto, and in some embodiments the opening region H1 may be a "blind" opening that is open at the top and wholly or partially obstructed at the bottom, either by a portion (not shown) of the substrate structure 100 or by another structure.

In one embodiment, a stack in which a first insulating layer and a second insulating layer including a material different from the first insulating layer are alternately and repeatedly stacked on a predetermined substrate, for example, a semiconductor substrate, may be formed. The substrate structure 100 may be formed by forming an opening region H1 in the stack, and selectively etching portions of the second insulating layers exposed on both sides of the opening region H1 to form a plurality of holes H10. However, the process of forming the substrate structure 100 may be variously changed.

The opening region H1 may have a rectangular pattern shape or a shape similar thereto when viewed from above. Accordingly, the opening region H1 may have a shape defining a trench extending in the Y-axis direction in the drawing. The holes H10 may be square holes or circular holes. When the holes H10 are formed as square holes, the holes H10 may extend in the Y-axis direction in the drawing. The holes H10 may be a kind of trench, and in some cases, may have a via structure. It may be understood that 'holes (grooves)' in the present specification may have various shapes and structures.

Figure 1B:
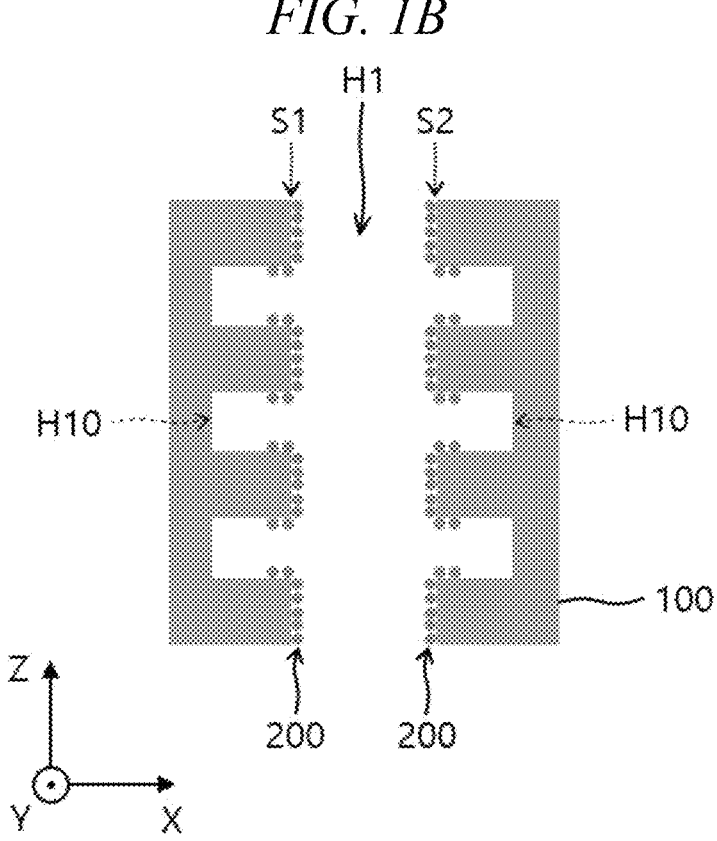

Referring to FIG. 1B, a process for adsorbing (as distinct from absorbing) an inhibitor 200 on a surface of the substrate structure 100 may be performed. Here, the inhibitor 200 may be referred to as a 'reaction inhibitor'. According to an embodiment of the present invention, by performing a process for adsorbing the inhibitor 200 on the surface of the substrate structure 100 under a deposition environment in which a vertical direction gas diffusivity is greater than a horizontal direction gas diffusivity, the inhibitor 200 may be differentially adsorbed so that an adsorption density of the inhibitor 200 on surfaces outside of the plurality of holes H10 may be higher than an adsorption density of the inhibitor 200 on surfaces inside of the plurality of holes H10. Processes for creating the deposition environment in which the gas diffusivity in the vertical direction is greater than the gas diffusivity in the horizontal direction will be described in detail later with reference to FIGS. 2A through 3B.

The inhibitor 200 may be adsorbed so that the adsorption density may be higher on the surfaces outside than on the surfaces inside of the holes H10. In this case, the adsorption density (such as a first average density) of the inhibitor 200 on the surfaces inside of the holes H10 may be lower than the adsorption density (such as a second average density) of the inhibitor 200 on the surfaces outside of the holes H10, that is, the first and second side portions S1 and S2 outside the holes H10. An adsorption density of the inhibitor 200 at an inlet portion (an entrance portion adjacent to the opening region H1) of the holes H10 and a periphery portion of the inlet portion may be higher than an adsorption density of the inhibitor 200 at a bottom portion (not adjacent to the opening region H1) of the holes H10 and a periphery portion of the bottom portion. For example, the adsorption density of inhibitor 200 at the inlet portion of the holes H10 and the periphery portion of the inlet portion may be about three times or more, or about five times or more than the adsorption density of the inhibitor 200 at the bottom portion of the holes H10 and the periphery portion of the bottom portion. Here, the 'inlet portion' of the holes H10 may mean a portion corresponding to about 10% to about 30% of the depth direction of the holes H10 from the inlet ends of the holes H10. In this way, the inhibitor 200 may be adsorbed to the surface of the inlet portion of the holes H10 with a relatively higher density than at the bottom portion of the holes H10 and the periphery portion of the bottom portion, and the inhibitor 200 may not be substantially adsorbed or may be adsorbed with only a small density at the bottom portion of the holes H10. In some cases, the adsorption density of the inhibitor 200 may sequentially decrease from the inlet portion of the holes H10 and the periphery of the inlet portion to the bottom portion of the holes H10.

The process for adsorbing the inhibitor 200 to the surface of the substrate structure 100 may include supplying a gaseous material containing the inhibitor 200 or a source of the inhibitor 200 into a chamber (not shown) in which the substrate structure 100 is provided, and then purging the chamber. Here, the gaseous material may be supplied from an upper portion of the opening region H1 in a depth direction of the three-dimensional surface or in a downward direction through the opening region H1. The purge gas for the purge may also be supplied from the upper portion of the opening region H1 to the downward direction through the opening region H1. The inhibitor 200 may be formed (adsorbed) as a monomolecular layer or formed (adsorbed) as a substantially monomolecular layer on the surface (a partial surface) of the substrate structure 100. However, in some cases, the purge step may not be performed.

The inhibitor 200 may include, for example, any one of carbon (C), hydrogen (H), and hydrocarbon (C—H) compounds in a ligand, and various known substances may be employed. However, the material of the inhibitor 200 is merely illustrative, and in some cases, may be variously changed. A material known as an inhibitor material used in a conventional atomic layer deposition (ALD) process may be applied to an embodiment of the present invention. The inhibitor 200 may increase the activation energy for surface adsorption in a reaction with a vapor-phase precursor which subsequently arrives at the deposited surface on which the inhibitor 200 is deposited, or may provide steric hindrance preventing the vapor-phase precursor from being deposited on the deposited surface through the molecular structure of the inhibitor 200. The inhibitor 200 may be referred to as a kind of surface protector, surface treatment agent, or surface modifier, and in this regard, the known techniques may be referred to.

Figure 1C:
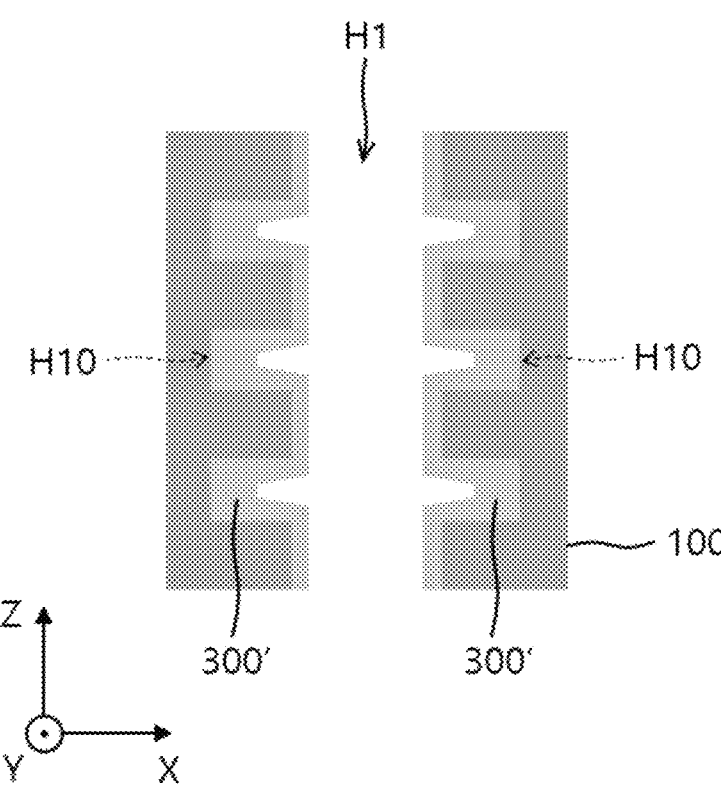
Figure 1D:
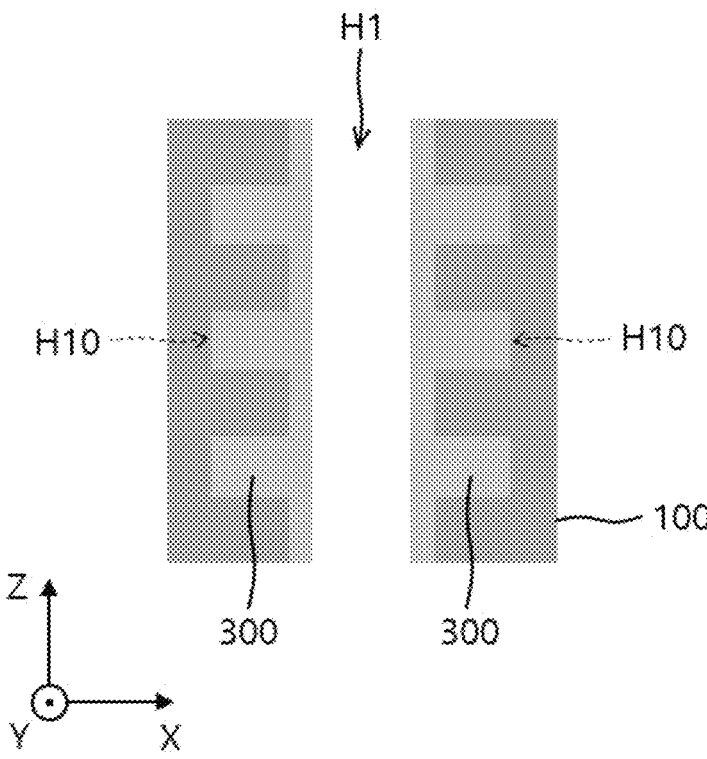

Referring to FIGS. 1C and 1D, a process for depositing a predetermined material film 300' and 300 may be performed on the inside and the outside of the plurality of holes H10. The reference numeral 300' in FIG. 1C schematically indicates a material film being deposited in an intermediate stage in which gap filling is not entirely completed, and the reference numeral 300 in FIG. 1D indicates a material film in a state in which the gap filling process is substantially completed. Therefore, it may be said that 300 includes 300'.

According to an embodiment of the present invention, a deposition rate of the material film 300 may vary depending on regions according to the respective adsorption density of the inhibitor (200 in FIG. 1B) of the regions. A deposition rate of the material film 300 may be relatively low in a surface region where an adsorption density of the inhibitor 200 is high, and a deposition rate of the material film 300 may be relatively high in a surface region where an adsorption density of the inhibitor 200 is low. Accordingly, the deposition rate of the material film 300 may be faster in the inner region than the outer region of the holes (grooves) H10. Also, the deposition rate of the material film 300 may be faster at the bottom portion of the holes H10 and at the periphery of the bottom portion than at the inlet portion of the holes H10 and the periphery of the inlet portion. Accordingly, according to the embodiment of the present disclosure, an overhang phenomenon of the deposition material at the inlet portion of the holes H10 may be prevented, and generally, a conformal deposition characteristic of the deposition film may be maintained from the inlet portion to the inner region of the holes H10. Therefore, a gap fill characteristic may be improved, and occurrence of defects such as voids and seams may be prevented.

The deposition process of the material film 300 may be performed by an atomic layer deposition (ALD) process. In this case, the deposition process of the material film 300 may include a first supply step for supplying a precursor gas including a precursor into the chamber in which the substrate structure 100 is provided, a first purge step of purging the chamber, a second supply step for supplying a reactant gas into the chamber, and a second purge step for purging the chamber. The first supply step, the first purge step, the second supply step, and the second purge step may constitute one ALD cycle, and the ALD cycle may be repeatedly performed.

The material film 300 may be a conductive film. In this case, the material film 300 may consist of a metal or a metal compound, or may include at least one of a metal and a metal compound. Preferably, the material film 300 may be a metal film. As a non-limiting example, the material film 300 may consist of tungsten or include tungsten. When the material film 300 is a metal film, the precursor may be a metal precursor. The metal precursor may include a predetermined metal atom and carbon, fluorine or chlorine bonded to the metal atom. Meanwhile, the reactant gas may include, for example, hydrogen (H$_2$) or ammonia (NH$_3$). However, specific materials of the precursor and the reactant gas may be variously employed.

During the depositing of the material film 300 (i.e., FIGS. 1C and 1D), some or all of the inhibitor (200 of FIG. 1B) may be removed from the substrate structure 100. The inhibitor 200 may have an excellent reaction inhibition function at the initial stage of deposition of the material film 300, but as the number of deposition cycles (i.e., ALD cycles) for deposition of the material film 300 increases, at least a portion of the inhibitor 200 may be gradually removed from the substrate structure 100, and the reaction inhibition characteristics due to the inhibitor 200 may be gradually reduced. In the embodiment of the present invention, since the inhibitor 200 may be mainly adsorbed to the inlet portion of the hole H10 and the region outside of the hole H10, a portion (a substantial portion) or all of the inhibitor 200 may be removed from the substrate structure 100 during the process of depositing the material film 300. Accordingly, problems such as deterioration of properties of the material film 300 due to the presence of residual amounts of inhibitor 200 may be prevented or minimized. As the number of deposition cycles (i.e., ALD cycles) for deposition of the material film 300 increases, even if the reaction inhibition characteristic by the inhibitor 200 is progressively decreased, since problems such as overhang were prevented, excellent gap fill characteristics may be secured until the deposition of the material film 300 is completed.

The thin film deposition process according to an embodiment of the present invention may be a kind of area selective deposition (ASD) process or a similar process thereto. The deposition rate of the material film 300 may be controlled according to regions by selectively adsorbing the inhibitor 200 to only a specific region or adsorbing the inhibitor 200 to a predetermined region with a density difference. In the thin film deposition process according to an embodiment of the present invention, the adsorbing of the inhibitor 200 and the depositing of the material film 300 may be performed in one chamber (a reaction chamber) as an in-situ process. In this case, there is an advantage that the process proceeds easily. However, in some cases, the adsorbing of the inhibitor 200 and the depositing of the material film 300 may be performed in separate chambers.

Hereinafter, a processes for forming the inhibitor 200 in the manner shown in FIG. 1B will be described in more detail with reference to FIGS. 2A and 2B and FIGS. 3A and 3B.

Figure 2A:
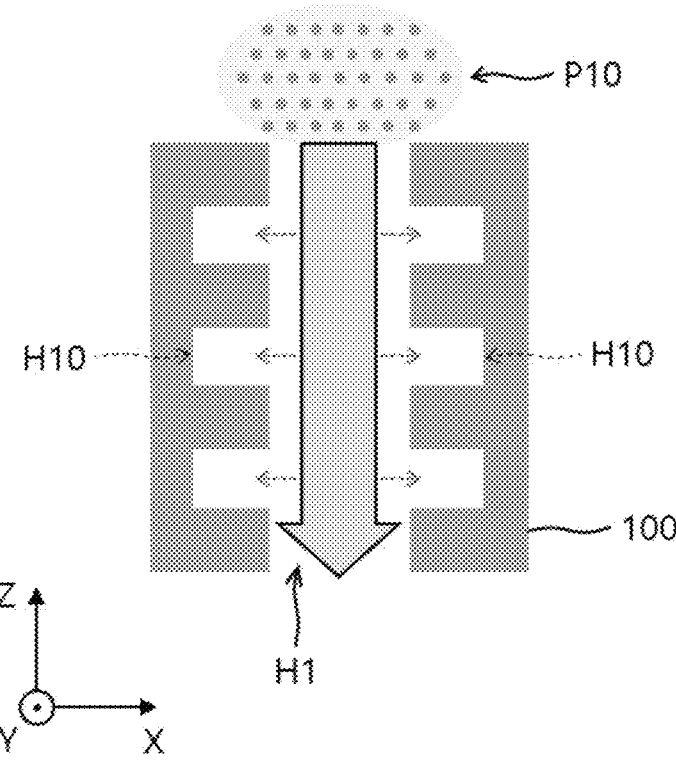
FIG. 2A and FIG. 2B are cross-sectional diagrams illustrating a thin film deposition process on a substrate structure having a three-dimensional pattern portion according to an embodiment of the present invention.
Figure 2B:
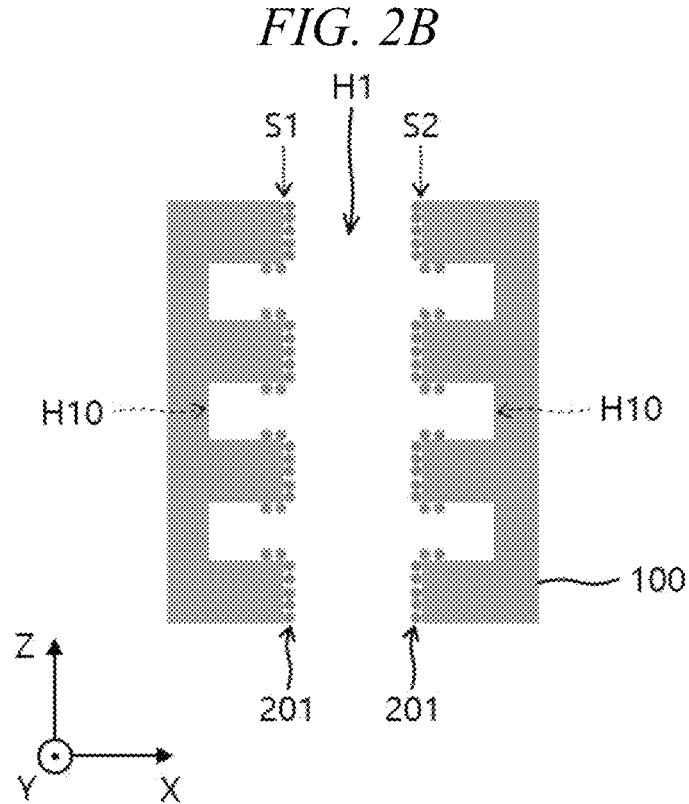

FIG. 2A and FIG. 2B are cross-sectional diagrams illustrating a thin film deposition process on the substrate structure 100 having a three-dimensional pattern portion according to an embodiment of the present invention. FIG. 2A and FIG. 2B specifically show a process (a first process) for forming the inhibitor 200 on the substrate structure 100 as shown in FIG. 1B.

Referring to FIG. 2A, the process of adsorbing the inhibitor in this embodiment may include generating a plasma P10 containing the inhibitor or an ionic species of the inhibitor and supplying the plasma P10 to the opening region H1. The plasma P10 may be generated by an AC or DC power source or by a high-density plasma source such as an induction coil plasma, but the present invention is not limited thereto. The plasma P10 may be supplied from an upper portion of the opening region H1 downward through the opening region H1 as indicated by a thick arrow. The ion species may have a greater diffusivity in a vertical direction (Z) than a horizontal direction (X) due to an electric field between the plasma P10 and the substrate structure 100, and the ion species may be diffused straightforwardly in the vertical direction rather than the horizontal direction. Most of the ionized inhibitors may move from the top to the bottom of the opening region H1, and some of the inhibitors may diffuse laterally along the small arrow. Such a delivery process of the inhibitor is referred to as anisotropic transfer in this specification, and the anisotropic transfer is characterized in that it dominantly uses drift due to an electric field of the inhibitor ion species caused by an electric field between the plasma P10 and the substrate structure 100, rather than a diffusion behavior caused by concentration. According to an embodiment of the present invention, the adsorption density of the inhibitor inside and outside the hole H10 may be adjusted for each region by generating ionic species of the inhibitor using plasma to control the flux of gas species of the inhibitor diffused into the opening region H1. This will be described in more detail with reference to FIG. 2B.

FIG. 2B shows an inhibitor 201 formed by the process of FIG. 2A. As shown in FIG. 2B, the adsorption density of the inhibitor 201 at the inlet portion of the hole H10 and its periphery may be higher than the adsorption density of the inhibitor 201 at the bottom portion of the hole H10 and its periphery. In some embodiments, the adsorption density of the inhibitor 201 at the inlet portion and its periphery of hole H10 may be approximately three to five times higher than the adsorption density of the inhibitor 201 at the bottom portion and its periphery of hole H10. As such, according to the embodiment of the present invention, a first adsorption density of the inhibitor 201 at the inlet portion of the hole H10 and the first and second side portions S1 and S2 outside the hole H10, that is, outside the hole H10, may be significantly increased relative to a second adsorption density of the inhibitor 201 at the bottom portion of the hole H10 and its periphery, and the inhibitor 201 may not be substantially adsorbed or may be adsorbed at a significantly lower density (relative to the first adsorption density) at the bottom portion of the hole H10.

In this embodiment, the power for generating the plasma P10 may be greater than 0 W and equal to or lower than 100 KW as a non-limiting example. The anisotropic adsorption process of the inhibitor 201 may be predominantly performed onto the substrate structure 100 under these power conditions, so that the ion species of the inhibitor are stably generated in the plasma P10. In addition, a predetermined inert gas may be further used in the generation of the plasma P10 to increase efficiency. The inert gas may be, for example, argon (Ar) gas, nitrogen ($N_2$) gas, and the like. Accordingly, Ar gas and/or $N_2$ gas may be ionized and included in the plasma P10.

In addition, in the present embodiment, a pressure of the chamber (not shown) in which the substrate structure 100 is provided may be lower than about $10^{-3}$ Torr. In one embodiment, in a state in which the pressure of the chamber provided with the substrate structure 100 is maintained at a pressure of about $10^{-3}$ Torr or less (i.e., a low pressure, and a high vacuum), the generating and supplying of the plasma P10 including the inhibitor or the ionic species thereof may be performed. As a non-limiting example, the pressure of the chamber in which the substrate structure 100 is provided may be in a range from a high vacuum of $10^{-12}$ Torr to $10^{-3}$ Torr.

Figure 3A:
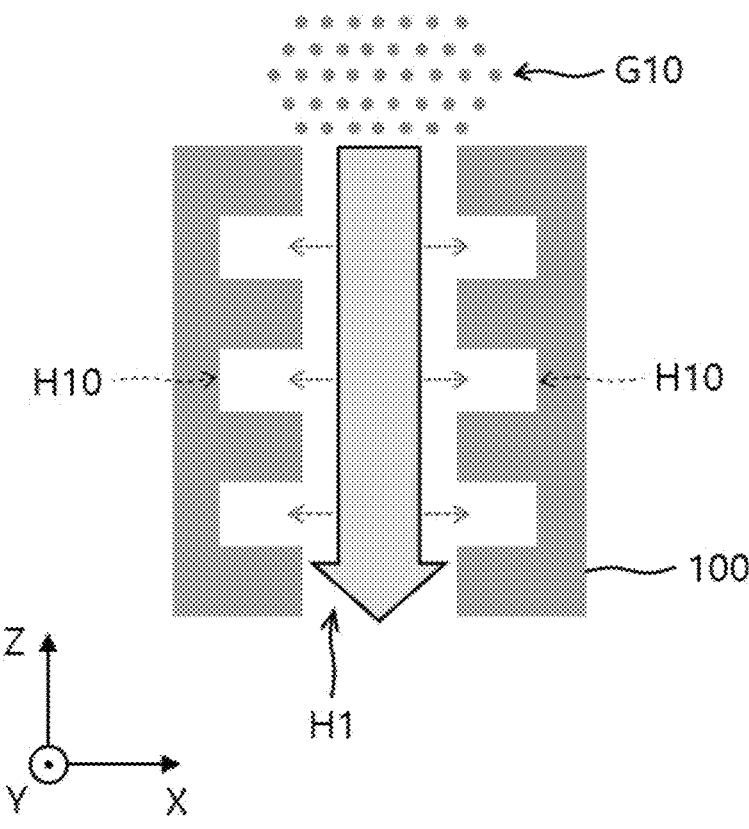
FIG. 3A and FIG. 3B are cross-sectional diagrams illustrating a thin film deposition process on a substrate structure having a three-dimensional pattern portion according to another embodiment of the present invention.
Figure 3B:
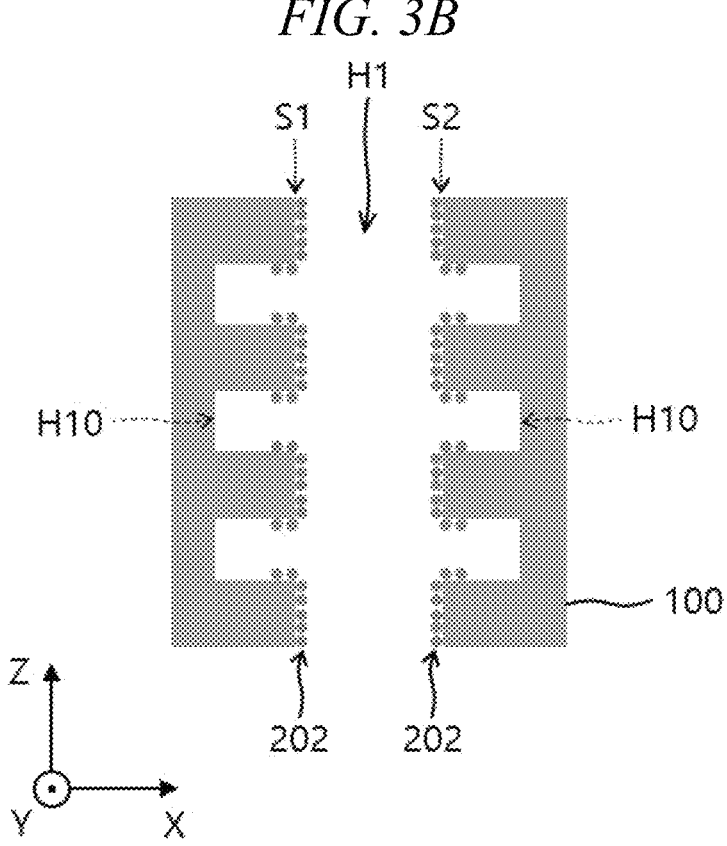

FIG. 3A and FIG. 3B are cross-sectional diagrams illustrating a thin film deposition process on the substrate structure 100 having a three-dimensional pattern portion according to another embodiment of the present invention. FIG. 3A and FIG. 3B specifically show a process (a second process) for forming the inhibitor 200 on the substrate structure 100 in FIG. 1B.

Referring to FIG. 3A, the adsorbing of the inhibitor in this embodiment may include setting a pressure condition of a chamber (not shown) in which the substrate structure 100 is provided as a first pressure condition, and supplying a gas G10 including the inhibitor to the opening region H1 under the first pressure condition. The gas G10 including the inhibitor may be supplied from an upper portion of the opening region H1 in a downward direction through the opening region H1. Under the first pressure condition, the gas G10 including the inhibitor may have a greater diffusivity in the vertical direction than in the horizontal direction. That is, according to an embodiment of the present invention, the gas G10 including the inhibitor may have a characteristic of diffusing (i.e., flowing) in the vertical direction rather than diffusing (i.e., flowing) in the horizontal direction under the first pressure condition. The characteristic in which the gas G10 including the inhibitor flows in the vertical direction rather than the horizontal direction may be referred to as a kind of 'viscous flow'. Accordingly, when the first pressure condition is used, the adsorption density of the inhibitor may differ greatly between inside and outside the hole H10.

In the first pressure condition, the pressure of the chamber may be in a range of about $10^{-3}$ Torr to about 1 atmosphere (atm), where 1 atm corresponds to 760 Torr. When the pressure in the chamber is about $10^{-3}$ Torr (a medium vacuum) to 1 atm (a low vacuum), the flow characteristics of the gas G10 including the inhibitor may be appropriately controlled, and as a result, the diffusivity in the horizontal direction of the gas G10 may decrease and the diffusivity in the vertical direction (up and down direction) may be greatly increased. Accordingly, the flow characteristics of the gas G10 may be controlled by appropriately controlling the pressure condition of the chamber.

FIG. 3B shows an inhibitor 202 formed by the process of FIG. 3A. As shown in FIG. 3B, a first adsorption density of the inhibitor 202 at the inlet portion of the hole H10 and the periphery of the inlet portion may be higher than a second adsorption density of the inhibitor 202 at the bottom portion of the hole H10 and the periphery of the bottom portion. In one embodiment, the first adsorption density of the inhibitor 202 at the inlet portion and its periphery of hole H10 may be approximately three times to five times higher than the second adsorption density of the inhibitor 202 at the bottom portion and its periphery of hole H10. The first adsorption density of the inhibitor 202 at the inlet portion of the hole H10 and the outside of the hole H10, that is, the first and second side portions S1 and S2 outside the hole H10 may be significantly higher than the second adsorption density of the inhibitor 202 at the bottom portion of the hole H10 and its periphery. At the bottom portion of the hole H10, the inhibitor 202 may not be substantially adsorbed or may be adsorbed with a relatively low density.

Subsequently, in connection with to the structure of FIG. 3B, the deposition process of the material film 300 as described with reference to FIGS. 1C and 1D may be performed. In this case, the deposition process of the material film 300 may be carried out under a second pressure condition different from the first pressure condition. The pressure of the chamber under the second pressure condition may be lower than the pressure of the chamber under the first pressure condition. The pressure of the chamber under the second pressure condition may be lower than about $10^{-3}$ Torr. The deposition process of the material film 300 may be performed while the pressure of the chamber in which the substrate structure 100 is provided is maintained at a pressure lower than about $10^{-3}$ Torr (i.e., a low pressure, and a high vacuum).

According to another embodiment of the present invention, the process using the straightness of the plasma described in FIG. 2A and the process that controls the flow of a gas (inhibitor gas) through the pressure control described in FIG. 3A may be used together. In this case, the adsorbing the inhibitor in the embodiment of the present invention may include setting the pressure condition of the chamber in which the substrate structure (that is, 100) is provided as the first pressure condition, generating a plasma including the inhibitor or the ionic species of the inhibitor, and supplying the plasma to the opening region (i.e., H1) under the first pressure condition. Here, the plasma may be the same as or similar to the plasma P10 described with reference to FIG. 2A. Also, the first pressure condition may be the same as or similar to the first pressure condition described with reference to FIG. 3A. Under the first pressure condition, the plasma may have a greater diffusivity in a vertical direction than in a horizontal direction. In the case of using both the straightness of the movement of the plasma and the process of controlling the flow of the gas (inhibitor gas) through pressure control, the inhibitor 200 as described in FIG. 1B may be more easily formed (adsorbed) in the desired configuration.

Figure 4A:
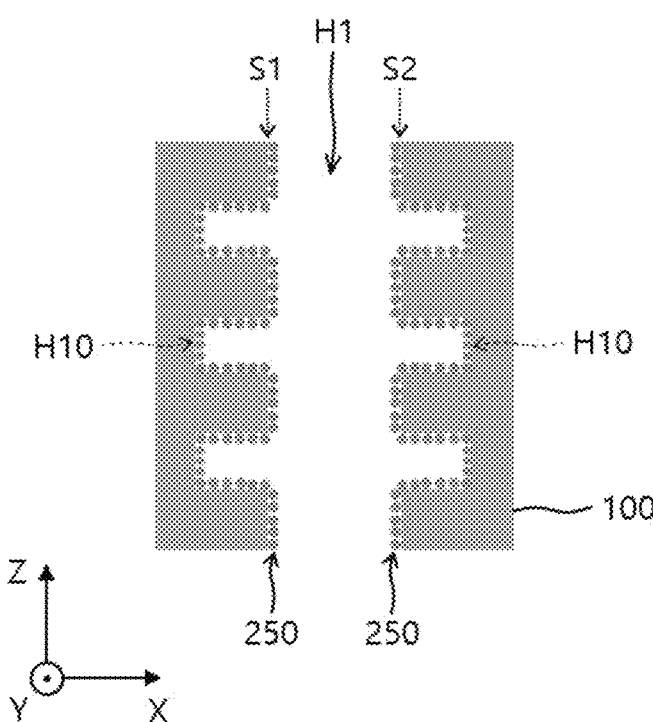
FIG. 4A and FIG. 4B are cross-sectional diagrams illustrating a thin film deposition process according to a comparative example and problems thereof.
Figure 4B:
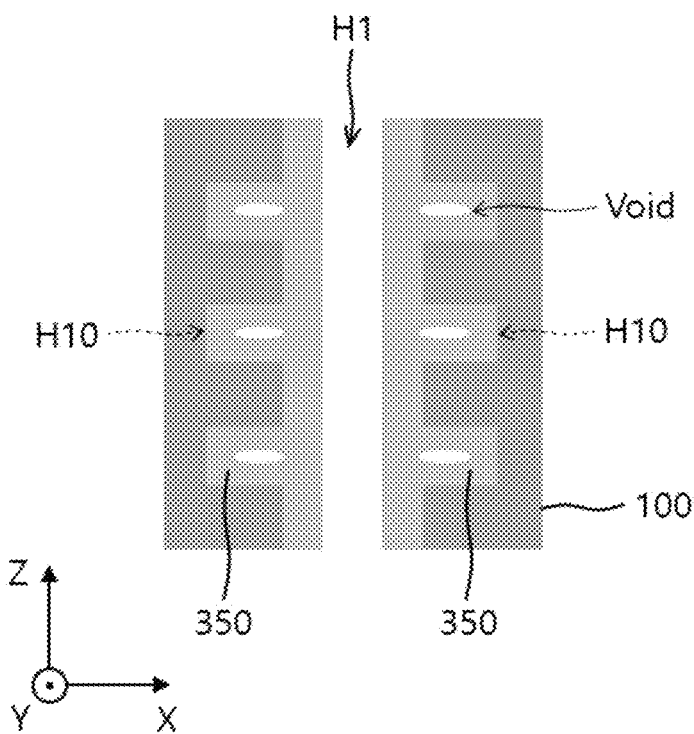

FIG. 4A and FIG. 4B are cross-sectional diagrams illustrating a thin film deposition process according to a comparative example and problems thereof.

Referring to FIG. 4A, an inhibitor 250 may be uniformly adsorbed onto a substrate structure 100 according to a conventional manner without distinction between regions. For example, the adsorption of the inhibitor 250 may be performed through a separate process such as a conventional atomic layer deposition (ALD) process or a self-assembled monolayer (SAM) forming process. In this case, the inhibitor 250 may be adsorbed to the inside and outside of the hole H10 at the same level of density. Therefore, it may be theoretically impossible to implement an area selective deposition (ASD) process by using the inhibitor 250 uniformly formed as described above.

FIG. 4B shows a case in which a material film 350 is deposited on the substrate structure 100 of FIG. 4A. As shown in FIG. 4B, when the material film 350 is deposited, it may be difficult to control the deposition rate inside and outside the hole H10. Furthermore, the defects such as voids or seams may occur in the material film 350 due to a problem such as formation of an overhang at the inlet portion of the hole H10. Here, the material film 350 may be, for example, a metal film applied as a gate electrode.

Figure 5:
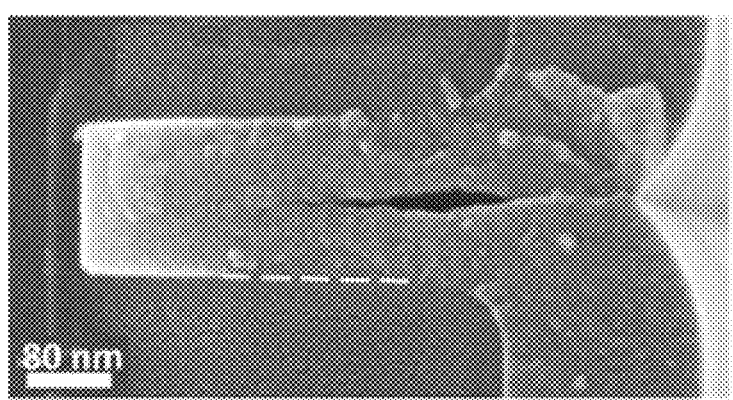
FIG. 5 is a scanning electron microscope (SEM) photographic image illustrating a metal film deposited according to a comparative example.

FIG. 5 is a scanning electron microscope (SEM) photographic image illustrating a deposited metal film according to a comparative example. Referring to FIG. 5, the voids as described with reference to FIG. 4B are observed.

Figure 6:
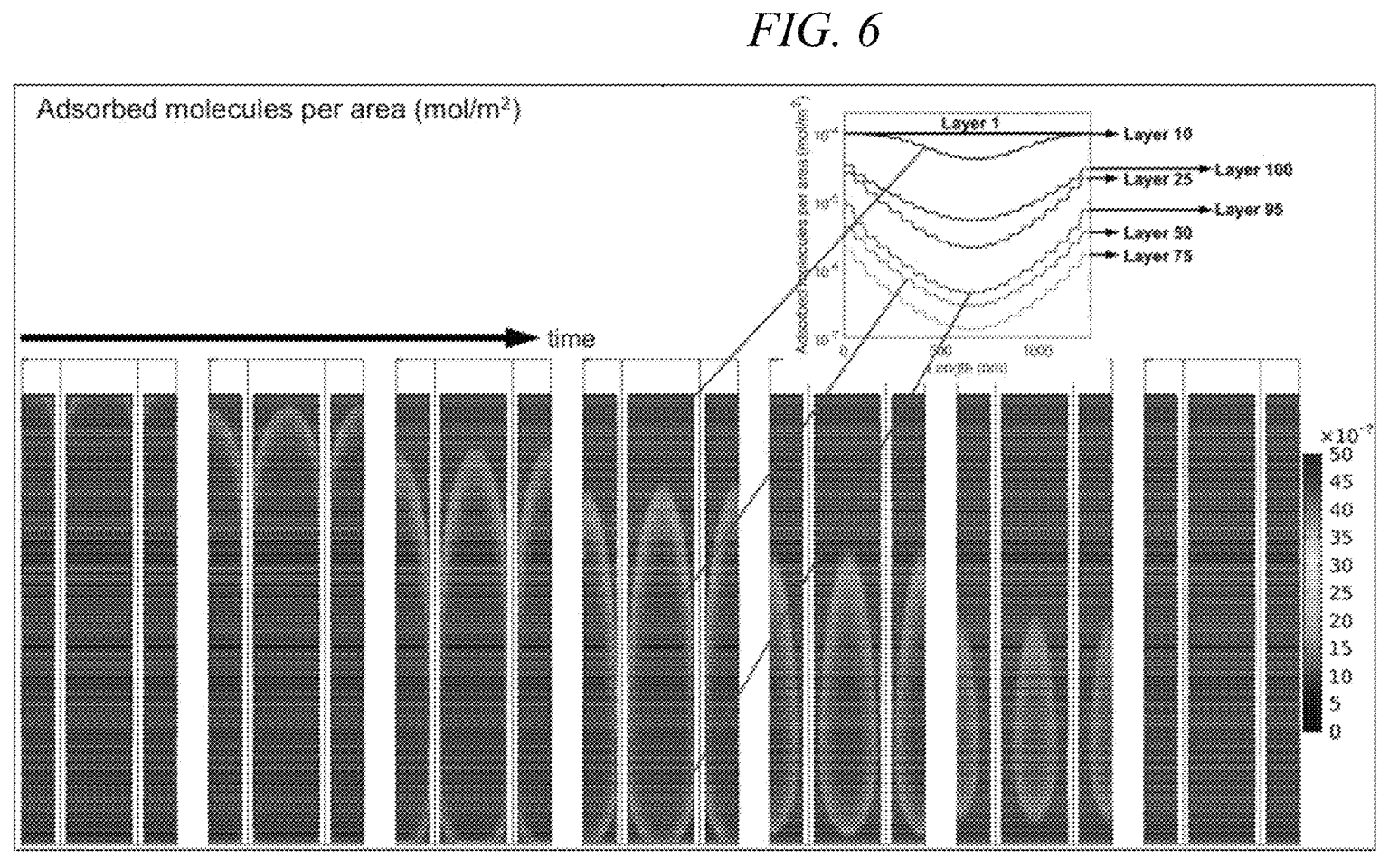

FIG. 6 is a simulation result illustrating a result evaluating diffusivity of gas diffused into vertical and horizontal directions in a pattern structure under a pressure condition according to a comparative example. The pressure condition according to the comparative example may be a low pressure and high vacuum condition corresponding to a general deposition pressure.

Referring to FIG. 6, it may be seen that the gas diffuses better in a horizontal direction (left and right direction) than in a vertical direction (up and down direction) under the pressure condition according to the comparative example. In this case, it may be said that the gas behaves according to a 'molecular flow'. Because it diffuses better in the horizontal direction than in the vertical direction in a pattern structure having a three-dimensional structure, it may be difficult to generate a difference in the adsorption density of a material (i.e., an inhibitor) inside and outside of a pattern such as a hole.

Figure 7:
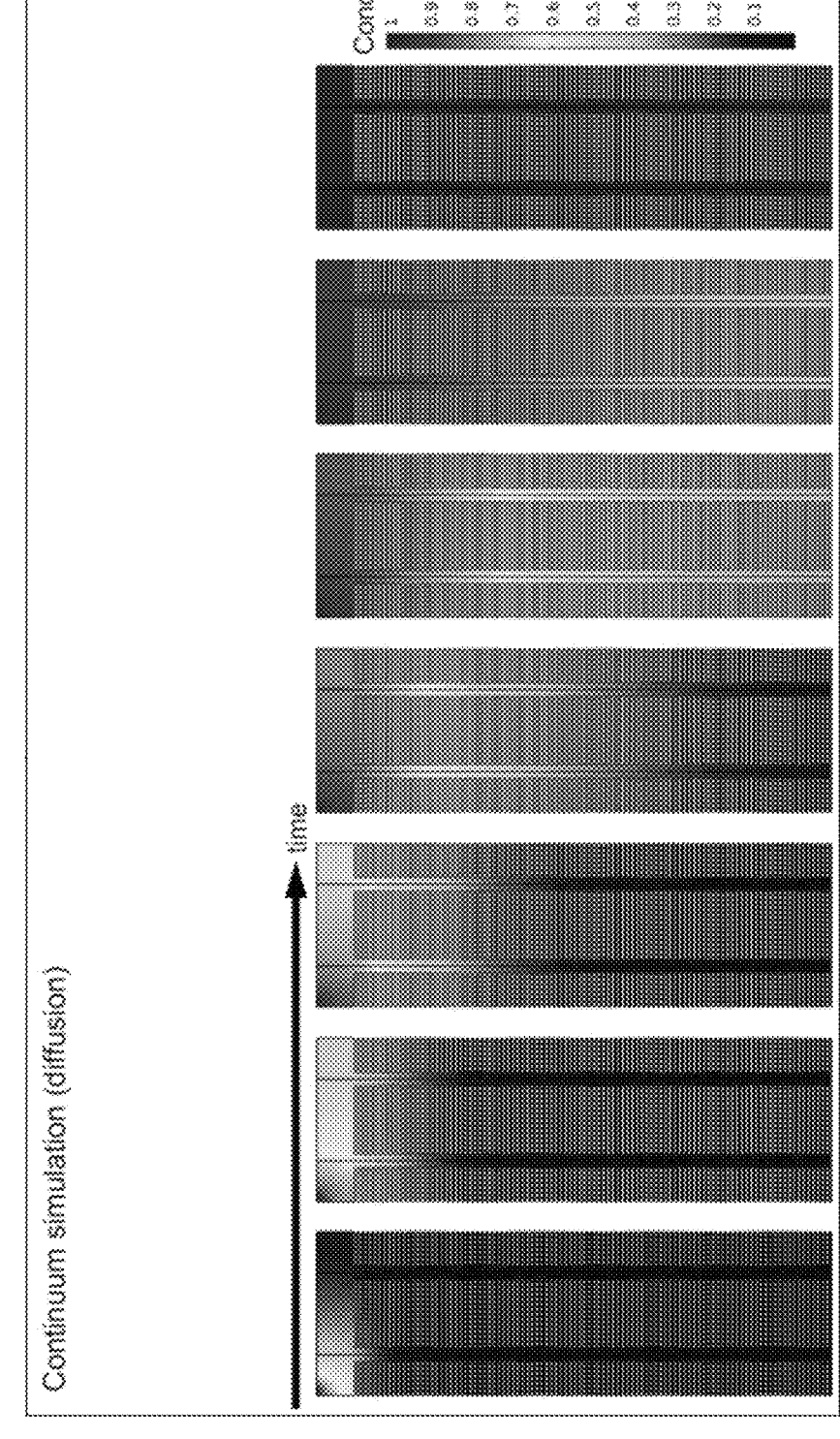
FIG. 7 is a simulation result illustrating diffusivity of gas diffused in vertical and horizontal directions in a pattern structure under a pressure condition according to an embodiment.

FIG. 7 is a simulation result illustrating a result evaluating diffusivity of gas diffused into vertical and horizontal directions in a pattern structure under a pressure condition according to an embodiment. The pressure condition according to the embodiment may correspond to the first pressure condition described with reference to FIG. 3A. Under the pressure condition according to the embodiment, the pressure of the chamber may be about $10^{-3}$ Torr to 1 atm.

Referring to FIG. 7, it may be seen that the gas diffuses better in a vertical direction (up and down direction) than in a horizontal direction (left and right direction) under the pressure condition according to the embodiment. In this case, it may be said that the gas behaves according to a 'viscous flow'. As it diffuses better in the vertical direction than in the horizontal direction within a pattern structure having a three-dimensional structure, it may be easy to generate a difference in the adsorption density of the material (i.e., an inhibitor) inside and outside of a pattern such as a hole, as shown in FIGS. 3A and 3B.

Through the simulation results of FIGS. 6 and 7, it may be confirmed that the flow characteristics of the gas may be changed by changing the pressure conditions, and the adsorption behavior of the inhibitor may be changed through the change of the pressure conditions.

The thin film deposition process according to the embodiments described with reference to FIGS. 1A to 3B may be usefully applied to various electronic device manufacturing methods. The manufacturing process of an electronic device according to an embodiment of the present invention may include preparing a substrate structure having a three-dimensional pattern portion and depositing a material film on the substrate structure by using the thin film deposition process according to an embodiment described above. In particular, the above-described thin film deposition process may be usefully utilized in manufacturing a three-dimensional V-NAND device using a three-dimensional pattern structure.

Figure 8A:
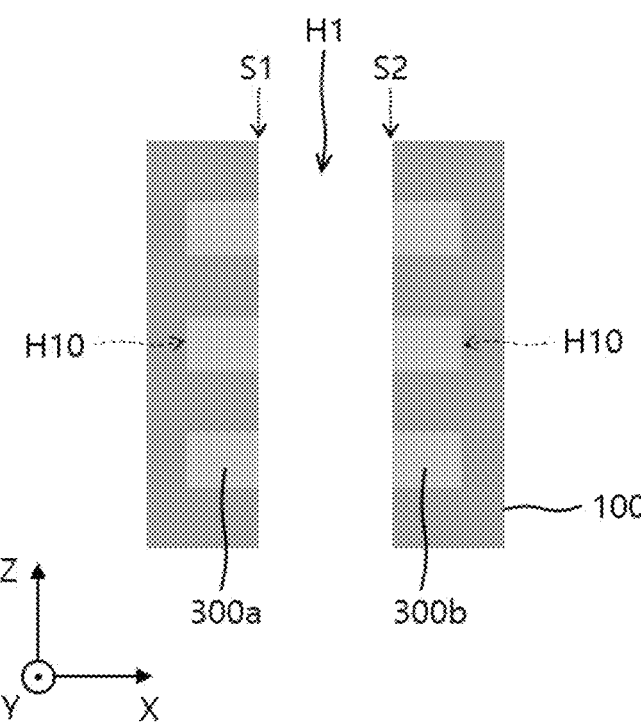
FIG. 8A and FIG. 8B are cross-sectional diagrams illustrating a manufacturing process of an electronic device to which a thin film deposition process according to an embodiment of the present invention is applied.
Figure 8B:
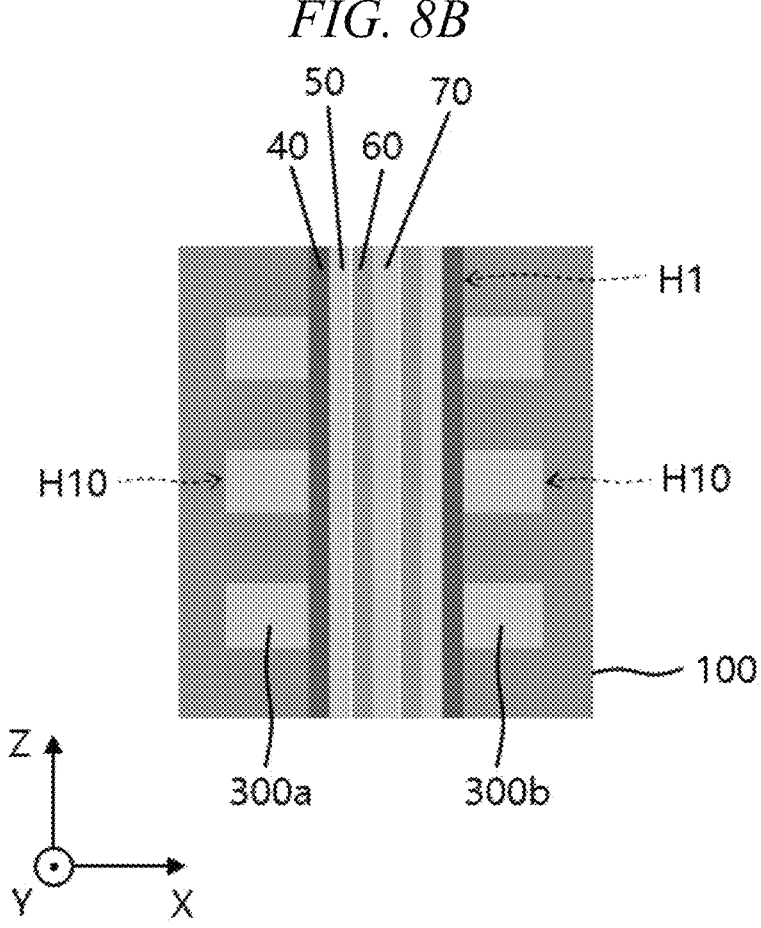

FIG. 8A and FIG. 8B are cross-sectional diagrams illustrating a manufacturing process of an electronic device to which a thin film deposition process according to an embodiment of the present invention is applied. Here, the electronic device may be a three-dimensional V-NAND device.

Referring to FIG. 8A, after the structure shown in FIG. 1D is prepared, a partial thickness of the material film 300 may be removed by etching. By removing portions of the material film 300 existing outside the plurality of holes H10, the patterned material films 300a and 300b may remain only inside the plurality of holes H10. Here, the patterned material films 300a and 300b may be conductive films. The patterned material film 300a disposed in the plurality of holes H10 on the first side portion S1 may be the first gate electrode 300a, and the patterned material film 300b disposed in the plurality of holes H10 on the second side portion S2 side may be the second gate electrode 300b. The first and second gate electrodes 300a and 300b may be defined (formed) from the material film 300.

Referring to FIG. 8B, a gate insulating layer 40, a charge storage layer 50, a tunnel insulating layer 60, and a channel layer 70 may be formed in the opening region H1. The gate insulating layer 40, the charge storage layer 50, the tunnel insulating layer 60, and the channel layer 70 may be sequentially disposed from a side of the first gate electrode 300a. Similarly, the gate insulating layer 40, the charge storage layer 50, the tunnel insulating layer 60, and the channel layer 70 may be sequentially disposed from a side of the second gate electrode 300b.

However, the structure of the electronic device (three-dimensional V-NAND device) as shown in FIG. 8B is merely illustrative, and may be variously changed depending on the case.

According to the embodiments of the present invention described above, it is possible to implement a thin film deposition process capable of overcoming the limitations and problems of the conventional thin film deposition method, effectively suppressing the occurrence of defects such as voids and seams in the substrate structure having a three-dimensional pattern structure, and securing excellent properties of the deposited thin film by performing a process for adsorbing an inhibitor in a deposition environment in which a gas diffusivity in the vertical direction is greater than a gas diffusivity in the horizontal direction with respect to the substrate structure, and then depositing a target material film thereon. Since the thin film deposition process according to the embodiments of the present invention may be usefully applied to the manufacture of various electronic devices, it may be possible to manufacture an electronic device having high integration and excellent performance by using the method.

In the present specification, the preferred embodiments of the present invention have been disclosed, and although specific terms are used, these are only used in a general sense to easily describe the technical contents of the present invention and to help the understanding of the present invention, and are not used to limit the scope of the present invention. It will be apparent to those of ordinary skill in the art to which the present invention pertains that other modifications based on the technical spirit of the present invention may be implemented in addition to the embodiments disclosed herein. It will be appreciated to those of ordinary skill in the art that the thin film deposition process described with reference to FIGS. 1A to 3B and FIGS. 8A and 8B and the manufacturing process of an electronic device to which the process is applied may be variously substituted, changed and modified without departing from the spirit of the present invention. Therefore, the scope of the invention should not be determined by the described embodiments, but should be determined by the technical concepts described in the claims.

EXPLANATION OF SYMBOLS

Explanation of Symbols for the Main Parts of the Drawing

| | |
|---|---|
| 40: gate insulating layer | 50: charge storage layer |
| 60: tunnel insulating layer | 70: channel layer |
| 100: substrate structure | 200, 201, 202: inhibitor |
| 300', 300: material film | 300a: first gate electrode |
| 300b: second gate electrode | G10: gas |
| H1: opening area | H10: hole |
| P10: plasma | S1, S2: side portion |

What is claimed is:

1. A thin film deposition method for a substrate structure having a three-dimensional pattern portion, comprising:
   preparing a substrate structure having an opening region formed in a vertical direction and a plurality of holes formed in a horizontal direction in each of two side portions exposed by the opening region;
   adsorbing an inhibitor to a surface of the substrate structure so that an adsorption density of the inhibitor on a surface outside of the plurality of holes is higher than an adsorption density on a surface inside of the plurality of holes by performing a process for adsorbing the inhibitor on the surface of the substrate structure in a deposition environment in which a gas diffusivity in the vertical direction is larger than a gas diffusivity in the horizontal direction; and
   performing a deposition process of a given material film on the surface inside of the plurality of holes and the surface outside of the plurality of holes, wherein a deposition rate of the material film varies according to the adsorption density of the inhibitor, and
   wherein the adsorbing and the performing are performed under a first pressure condition and a second pressure condition, respectively, and the pressure condition in a chamber under the second pressure condition is lower than the pressure condition in the chamber under the first pressure condition.

2. The thin film deposition method of claim 1, wherein a first adsorption density of the inhibitor at an inlet portion of the hole and a portion peripheral to the inlet portion is higher than a second adsorption density of the inhibitor at a bottom portion of the hole and a portion peripheral to the bottom portion.

3. The thin film deposition method of claim 2, wherein the first adsorption density of the inhibitor is at least three times higher than the second adsorption density.

4. The thin film deposition method of claim 1, wherein adsorbing the inhibitor includes generating a plasma including the inhibitor or an ionic species of the inhibitor, and supplying the plasma to the opening region, and
   wherein the plasma has a larger diffusivity in a vertical direction than in a horizontal direction.

5. The thin film deposition method of claim 1, wherein adsorbing the inhibitor includes setting the pressure condition of the chamber in which the substrate structure is provided as the first pressure condition, and supplying a gas including the inhibitor to the opening region under the first pressure condition, and
   wherein the gas including the inhibitor has a larger diffusivity in a vertical direction than in a horizontal direction under the first pressure condition.

6. The thin film deposition method of claim 5, wherein the pressure condition of the chamber under the first pressure condition is in the range of about $10^{-3}$ Torr to 1 atm.

7. The thin film deposition method of claim 1, wherein adsorbing the inhibitor includes setting the pressure condition of the chamber in which the substrate structure is provided as the first pressure condition, generating a plasma including the inhibitor or an ionic species of the inhibitor, and supplying the plasma to the opening region under the first pressure condition, and
   wherein the plasma has a larger diffusivity in a vertical direction than in a horizontal direction under the first pressure condition.

8. The thin film deposition method of claim 1, wherein the deposition process of the material film is performed using an atomic layer deposition (ALD) process.

9. The thin film deposition method of claim 1, wherein the material film is a conductive film.

10. A manufacturing method of an electronic device, the method comprising:
   preparing a substrate structure having a three-dimensional pattern portion; and
   depositing a material film on the substrate structure using a thin film deposition method according to claim 1.

11. The manufacturing method of claim 10, wherein the electronic device includes a three-dimensional Vertical-NAND flash device.

12. The manufacturing method of claim 11, wherein the material film is a conductive film, and the manufacturing method further comprises defining a gate electrode from the conductive film.

* * * * *